United States Patent [19]

Gerst et al.

[11] 4,405,895
[45] Sep. 20, 1983

[54] ANGLE DIGITIZING METHOD

[75] Inventors: Carl W. Gerst, Skaneateles; Leonard J. Paciorek, North Syracuse; Thomas L. Sly, Cicero, all of N.Y.

[73] Assignee: Anaren Microwave, Inc., Syracuse, N.Y.

[21] Appl. No.: 272,489

[22] Filed: Jun. 11, 1981

[51] Int. Cl.³ .............................................. G01R 25/00
[52] U.S. Cl. ................................ 324/83 D; 324/83 Q; 324/DIG. 1
[58] Field of Search ................. 324/83 R, 83 D, 83 Q, 324/DIG. 1, 86, 79 R, 79 D; 364/487

[56] References Cited

U.S. PATENT DOCUMENTS 4,277,748 7/1981 Gerst et al. ....................... 324/83 D Primary Examiner—Michael J. Tokar Attorney, Agent, or Firm—Hane, Roberts, Spiecens & Cohen

[57] ABSTRACT

An angle digitizer receives signal representing the sine and cosine of the angle to be digitized. The voltages are fed to orthogonal pairs of input terminals. Between each two input terminals is a set of equivalued resistors to form a resistor ring. At the junction of each pair of resistors is an output terminal. Each pair of output terminals is connected to the input terminals of a signal amplitude comparator which compares the magnitude of the signals at its inputs to give a digital signal in accordance with which is greater. For each comparator the output terminals of the resistor ring are selected such that the signals are in a direct antiphase relationship. An odd set of the comparators is activated first followed by the activation of the even set. Thereafter the binary output values of the comparators are interleaved to form a full digital word which is then tested to see if it is a valid digital word.

11 Claims, 1 Drawing Figure

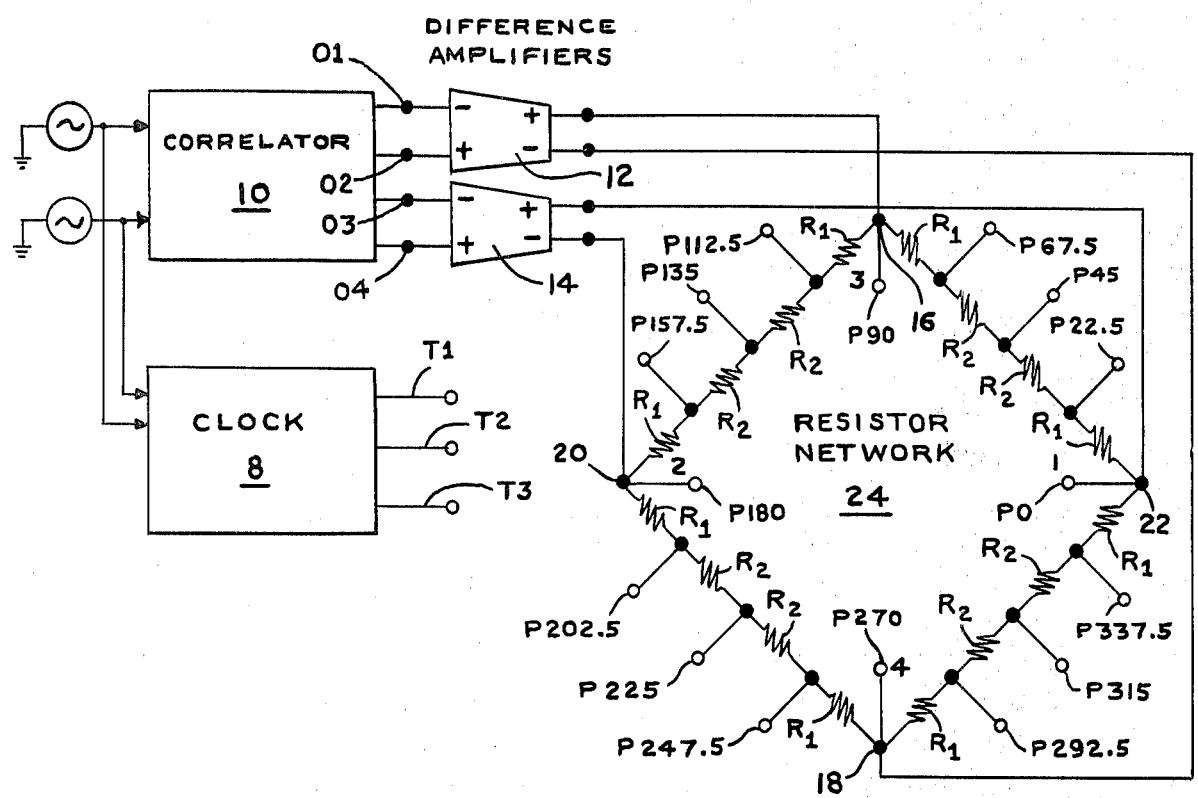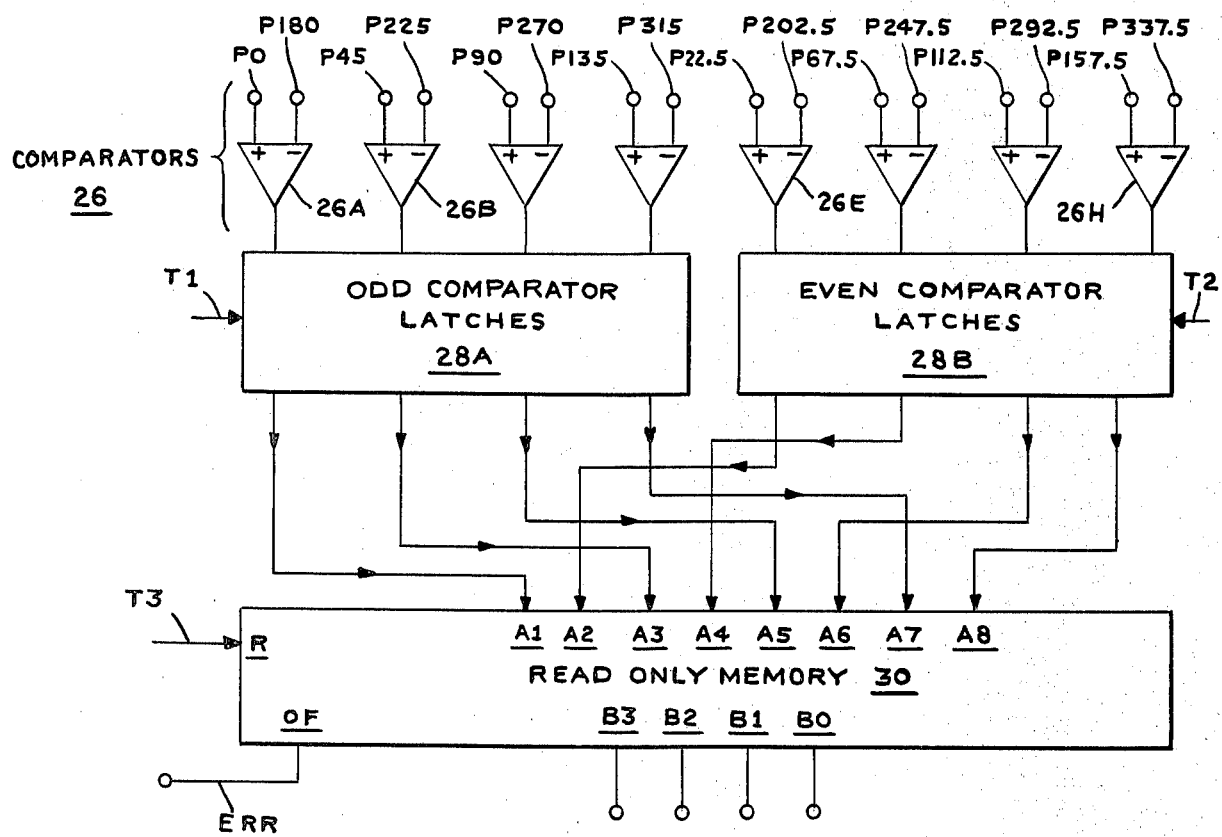

ANGLE DIGITIZING METHOD

BACKGROUND OF THE INVENTION

This invention pertains to methods for converting signals representing trigonometric functions of angles to coded combinations of binary signals representing the angles.

In measuring the frequency of microwave signals, or the bearing angle of incoming radar signals, or the polarization of such signals, as well as phase differences, correlators are used. The outputs of the correlators are generally signals which are sine and cosine functions of a phase angle. At first these signals were displayed on a calibrated CRT display. As time progressed much greater accuracies were required.

The art started to move toward digital techniques. Typical devices as analog signal processors are shown in U.S. Pat. No. 3,800,221 issued Mar. 26, 1974. These signal processors while they satisfied the need were complex and cumbersome and created the demand for even better digitizers. Such a digitizer is shown in our copending application Ser. No. 70,687 filed Aug. 29, 1979, entitled ANGLE DIGITIZER. The present invention is an improvement in the use of such a digitizer to enhance its reliability when trying to measure the phase angles of signals when two different signals occur slightly time displaced with respect to each other. For example, in electronic warfare techniques quite often incoming radar signals from two different sources occurs very close together in time. Heretofore this phenomenon could cause a complete misreading of the frequency or bearing angle of each of the signals.

SUMMARY OF THE INVENTION

It is accordingly a general object of the invention to provide an improved angle digitizing method which is immune to such phenomena.

The invention relies on the pattern of intermediate output signals (digital words) generated by the above-mentioned angle digitizer. Table I summarizes these intermediate output signals.

TABLE I

| ANGLE | INTERMEDIATE DIGITAL WORD | | | | | | | |
|---|---|---|---|---|---|---|---|---|
| 000.0 | 1 | 1 | 1 | 1 | 0 | 0 | 0 | 0 |
| 022.5 | 1 | 1 | 1 | 1 | 1 | 0 | 0 | 0 |
| 045.0 | 1 | 1 | 1 | 1 | 1 | 1 | 0 | 0 |
| 067.5 | 1 | 1 | 1 | 1 | 1 | 1 | 1 | 1 |
| 090.0 | 1 | 1 | 1 | 1 | 1 | 1 | 1 | 0 |
| 112.5 | 0 | 1 | 1 | 1 | 1 | 1 | 1 | 1 |
| 135.0 | 0 | 0 | 1 | 1 | 1 | 1 | 1 | 1 |
| 157.5 | 0 | 0 | 0 | 1 | 1 | 1 | 1 | 1 |
| 180.0 | 0 | 0 | 0 | 0 | 1 | 1 | 1 | 1 |
| 202.5 | 0 | 0 | 0 | 0 | 0 | 1 | 1 | 1 |
| 225.0 | 0 | 0 | 0 | 0 | 0 | 0 | 1 | 1 |
| 247.5 | 0 | 0 | 0 | 0 | 0 | 0 | 0 | 1 |
| 270.0 | 0 | 0 | 0 | 0 | 0 | 0 | 0 | 0 |
| 292.5 | 1 | 0 | 0 | 0 | 0 | 0 | 0 | 0 |
| 315.0 | 1 | 1 | 0 | 0 | 0 | 0 | 0 | 0 |
| 337.5 | 1 | 1 | 1 | 0 | 0 | 0 | 0 | 0 |

It is seen that for each angular segment the intermediate digital word consists of a set of logic "1"s and "0"s. But in each word there is at most one transition in logic values when all positions of the number are scanned. In other words each word consists of at most one string of "0"s and one string of "1"s. Because of the fact that errors occur when two signals are slightly displaced in time, the invention contemplates determining the values of the odd positions of the intermediate digital word at one time and determining the values of the even positions of the intermediate at a later time and then interleaving the two determinations to form the intermediate digital word. It can be shown that such a formed intermediate digital word can be of the type having no more than one transition in logic values only if the two determinations were made with respect to the same difference angle. Thus if the formed word does have two or more transitions an indication is given that the measurement is erroneous.

Briefly, the invention contemplates a method of improving the reliability of the reading of apparatus for converting signals representing sin $\theta$ and cos $\theta$ to a digital value representing the angle $\theta$ wherein signal representing sin $\theta$ is connected across a set of first and second input terminals and the signal representing cos $\theta$ is connected across another set of third and fourth input terminals. Between each two input terminals there is connected a set of the same number of equivalent impedors to form a ring. At the junction of each pair of adjacent impedors there is an output terminal. A plurality of two-input logic means which give binary signals at their outputs are connected to the output terminals of the ring. In particular each logic means is connected to a pair of output terminals which are in an antiphase relationship. An odd subset of the plurality is sampled at one time and an even subset of the plurality is thereafter sample. The results of the two samplings are interleaved to form a digital word. This digital word is a valid digital representation of the angle $\theta$ only if it has certain properties.

BRIEF DESCRIPTION OF THE DRAWING

Other objects, the features and advantages of the invention will be apparent from the following detailed description of the invention when read with the accompanying drawing which shows the presently preferred embodiment of the invention. The sole FIGURE of the drawing is a block diagram of apparatus for digitizing analog angle-representing signals.

DESCRIPTION OF THE PREFERRED EMBODIMENT

In FIG. 1 the correlator 10 receives two signals whose phase difference is to be measured. A typical correlator can be that shown in U.S. Pat. No. 3,517,309 up to the outputs of the low pass filters LP1 to LP4 which are then connected to the terminals 01 to 04 of the present FIG. 1. In addition at least one of the signals or a signal derived therefrom is fed to clock 8. The clock 8 in response to the leading edge of a received signal emits three pulses in sequence and spaced in time on lines T1, T2 and T3 respectively.

The terminals 01 and 02 are connected to the negative and positive input terminals of balanced difference amplifier 12 which emits across its positive and negative output terminals a signal proportional to sin $\theta$, where $\theta$ is the phase difference between the two signals whose phase difference is being measured. Similarly the terminals 03 and 04 are connected to the negative and positive input terminals of balanced difference amplifier 14 which emits across its positive and negative output terminals a signal proportional to cos $\theta$, where $\theta$ is the phase difference between the two signals whose phase difference is being measured.

The output terminals of the difference amplifiers 12 and 14 are connected to input terminals of resistor network 24. The resistor network has four input terminals 16, 18, 20 and 22. The pair of input terminals 16 and 18 are connected to the output terminals of amplifier 12 so that a signal proportional to sin θ is developed across terminals 16 and 18. The pair of input terminals 20 and 22 are connected to the output terminals of amplifier 14 so that a signal proportional to cos θ is developed across terminals 20 and 22. Between input terminal 16 and input terminal 20 there is a set of weighted resistors $R_1$, $R_2$, $R_n$ and $R_1$. Between input terminals 20 and 18 there is an equivalent set of the resistors. Similarly between input terminals 18 and 22 and input terminals 22 and 16. The number of resistors in each set must be the same. The number is chosen based on the desired resolution. The resolution is determined by the following formula $$\text{Resolution} = \theta = 360°/4n$$

where n is the number of resistors in a set. In FIG. 1, by way of example, there are four resistors per set. Hence, the resolution is 22.5°.

The values of the resistors are chosen according to the following formula $$R_N = \frac{1}{1 - \tan[-90° + N\theta]} - \frac{1}{1 - \tan[-90° + (N+1)\theta]};$$

where θ is definite above; and N= the numerical position of the resistor with respect to the output terminals. Thus, $R_1 = 0.293 R$; and $R_2 = 0.207 R$; where R is the total resistance between a pair of output terminals.

Although the resistor layout in FIG. 1 is shown as a square it can be called a ring as long as it has the following properties. The input terminals of each pair must be separated by 2n resistors. Thus, in FIG. 1 the pair of terminals 16 and 18 are separated by eight resistors and the pair of input terminals 20 and 22 are separated by eight resistors. The connection between any two input terminals one from each pair is only by one set of serially connected resistors.

Connected to the junction of each adjacent pair of resistors R is and output terminal PN. In FIG. 1 the output terminals have been given reference numerals equivalent to angular relationships assuming the output terminal PO connected to terminal 22 is considered zero phase and the sine and cosine inputs are as stated above. There is a defined relationship between pairs of output terminals. A pair of output terminals is considered in antiphase when and only when 2n resistors separate the two terminals around the loop. For tutorial reasons the output terminals have been reference numerals equivalent to the direction of a radius vector for the heretofore used CRT display devices.

The pairs of output terminals in antiphase relationship are connected to the inputs of 2n two-input logic means in the form of signal magnitude comparators 26. Since for the present example there are four resistors per set there are eight comparators 26A to 26H. These comparators can take many forms but for the preferred embodiment it is assumed that the signals at the outputs of the amplifiers 12 and 14 swing about a positive quiescent level of such amplitude that the signals at the output terminals PN never go negative. Therefore, the comparators are such that whenever the signal at a (+) input is greater than the signal at a (−) input the comparator output is high or "1." Otherwise, the comparator output is low or "0."

The comparators 26A to 26H are arrayed into two subsets, i.e., into an odd subset which includes comparators 26A and 26D and an even subset which consists of the remaining comparators 26E to 26H. The designation odd and even comes from the association of the particular comparators with the particular bit positions of the intermediate digital word. The bit positions are again related to the output terminals of the ring as discussed above.

The odd comparators 26A to 26D are connected to the respective inputs of four odd comparator latches 28A which are strobed by a signal on line T1. Similarly, the even comparators 26E to 26H are connected to the respective inputs of even comparator latches 28B which are strobed by a signal on line T2. The outputs of the comparator latches are interleaved and connected to the address inputs of read only memory 30 which is activated to read by a signal on line T3.

Two sets of data are stored in memory 30. The first set is addressed by the intermediate digital words shown in Table I above and for each digital word emits a four bit binary number is straight binary or binary-coded decimal code. For example, it would translate the digital code 11110000 to 0000 in binary code and the digital code 11100000 to 1111 in binary code. Such techniques are well known in the art and will not be discussed. The second set includes every other possible combination of the eight bits. However, each one of these combinations results from an erroneous reading. Therefore, each one of these combinations addresses one of a plurality registers each of which stores a flag bit which is emitted from output of onto line ERR.

The apparatus operates as follows: correlator 10 receives the two signals (usually the signal to be measured and a delayed occasion thereof) whose phase difference is to be measured and transmits signals to balanced difference amplifiers 12 and 14. Across terminals 16 and 18 there is developed a signal proportional to sin θ while across terminals 20 and 22 there is developed a signal proportional to cos θ. Hence at each output terminal PN there is a signal functionally related to the vector sum of sin θ and cos θ. For example, assume that the phase difference is 0°, then there is no signal across terminals 16 and 18 (sin 0°=0) and maximum signal between terminals 20 and 22 (cos 0°=1) with terminal 22 positive with respect to terminal 20. Thus, the signals at output terminals PO, P22.5, P45, P67.5, P337.5, P315, and P292.5 are greater than at terminals P180, P202.5, P225, P247.5, P112.5, P135 and P157.5. Thus, the intermediate digital word will be 1111×000. There is an ambiguity at comparator 26E since both inputs are zero. However, because of hysteresis and bias it could be forced to emit a low signal for this case. (It should be noted that working systems there are included networks which sense for such ambiguities and rely on different criteria to resolve the ambiguity.)

At the same time the leading edge of the signals triggered the clock 8 which first emits a pulse on line T1. If it is assumed that the intermediate digital word is 00001111 (lsb on the left) then these will be loaded into latches 28A the bits 0011 (lsb on the left). Thereafter, e.g. 50 nanoseconds, a pulse on line T2 strobes the latches 28B which receive the bits 0011 (lsb on the left) assuming no change in the input signals. Sometime thereafter a pulse on line T3 initiates a read out of the contents of the register having address 00001111 (lsb on left) which will be 0000 and no error flag.

If however between the time of the pulses on lines T1 and T2 the intermediate digital word changed say to 11111111 because of an adjacency in time of incoming signals, i.e., the correlator receives a different incoming signal and a delayed version thereof. Then these would be loaded into latches 28B the bits 1111. Thus the address 01011111 would be generated by the latches after the interleaving to the address inputs of memory 30. Such intermediate word (address) is erroneous. Therefore, these will be emitted from memory 30 a signal on line ERR since the associated register was storing such signal.

The signal on line ERR could be fed back to the clock 8 to initiate another sampling cycle while at the same time indicating to a downstream processor the erroneous reading.

In general the angle digitizers are in a "gas meter" arrangement wherein each generates a binary coded digit. Therefore the lines ERR are connected in an OR-function so that the validity of the overall number is indicated.

While only one embodiment of the invention has been shown and described in detail there will now be obvious to those skilled in the art many modifications and variations satisfying many or all of the objects of the invention without departing from the spirit thereof as defined by the appended claims.

What is claimed is:

1. In apparatus for converting a signal representing sin $\theta$ and a signal representing cos $\theta$ to a digital value representing the angle $\theta$ which includes first and second input terminals across which is applied a signal proportional to sin $\theta$, third and fourth input terminals across which is applied a signal proportional to cos $\theta$, four sets of the same number of impedors, a first of the sets being connected between the first and third input terminals, a second of the sets being connected between the third and second input terminals, a third of the sets being connected between the second and fourth input terminals, a fourth of the sets being connected between the fourth and first input terminals, a plurality of output terminals, each of the output terminals being connected to the junction of each pair of adjacent impedors, and a plurality of two-input logic means for giving a first level signal at an output when the signal at one input is greater than the signal at the other input and for giving a second level signal at said output when the signal at said one input is less than the signal at said other input, the two inputs of each logic means being connected to a pair of said output terminals which have an antiphase relationship whereby each logic means generates a bit value associated with a different position of a digital word, the method of increasing the reliability of the apparatus comprising the steps of sampling a first subset of the logic means to obtain the bits of a first partial digital word, a given time thereafter sampling a second subset of the logic means to obtain the bits of a second partial digital word, combining the first and second partial digital words to form a complete digital word, and determining if said full digital word is in a set of digital words representing angles.

2. The method of claim 1 wherein said combining comprises interleaving the bits of the two partial digital words.

3. The method of claim 1 or 2 wherein one partial digital word comprises the odd positional bits of the full digital word and the other partial digital word comprises the even positional bits of the full digital word.

4. The method of claim 1 or 2 wherein said determining step comprises determining whether the full digital word includes more than one transition in logic values across the entire digital word.

5. The method of claim 4 wherein when the full digital word has more than one of said transitions indicating an error and when the full digital word has no more than one of said transitions emitting a coded combination of bits indicating an angle value.

6. The method of claim 4 when an error indication is given reinitiating the steps of the method.

7. In apparatus for converting an analog value to a digital value by generating a plurality of bits in parallel to represent the analog value, the method of increasing the reliability of such conversion by generating a first subset of the bits, a given time thereafter generating a second subset of the bits, combining the first and second subsets to form an intermediate digital value, and determining if said intermediate digital value is in a set of given digital values.

8. The method of claim 7 wherein the given set is an allowed set of digital values.

9. The method of claim 7 wherein the combining step comprises interleaving the bits of the subset.

10. The method of claim 7 wherein said set is one of two sets of digital values.

11. The method of claim 10 wherein one of said sets indicated there was a change in the analog value within the given time.

* * * * *